United States Patent [19]

Kinoshita

[11] Patent Number: 5,119,387
[45] Date of Patent: Jun. 2, 1992

[54] SEMICONDUCTOR LASER OF VISIBLE RAY REGION HAVING WINDOW STRUCTURE

[75] Inventor: Hideaki Kinoshita, Yokohama, Japan

[73] Assignee: Kabushiki Kaisha Toshiba, Kawasaki, Japan

[21] Appl. No.: 747,981

[22] Filed: Aug. 21, 1991

[30] Foreign Application Priority Data

Aug. 23, 1990 [JP] Japan .................................. 2-219952

[51] Int. Cl.⁵ ................................................ H01S 3/19
[52] U.S. Cl. ............................................................ 372/46
[58] Field of Search ............................... 372/46, 47, 48

[56] References Cited

U.S. PATENT DOCUMENTS 5,020,068 5/1991 Isshiki ................................... 372/46
5,048,037 9/1991 Arimoto et al. ....................... 372/46

Primary Examiner—William L. Sikes
Assistant Examiner—Robert E. Wise
Attorney, Agent, or Firm—Finnegan, Henderson, Farabow, Garrett and Dunner

[57] ABSTRACT

A semiconductor laser including a semiconductor substrate having a high resistance region at both ends, an active layer sandwiched between two clad layers, and a window structure having both end surfaces facing each other. Each of the both end surfaces includes end portions of the active layer and the two clad layers, respectively. Since each of the end portions is disposed above the high resistance region of the semiconductor region of the semiconductor substrate, it has a band gap higher than an internal portion of the active layer and the two clad layers, respectively, thereby providing an improved window effect.

11 Claims, 7 Drawing Sheets

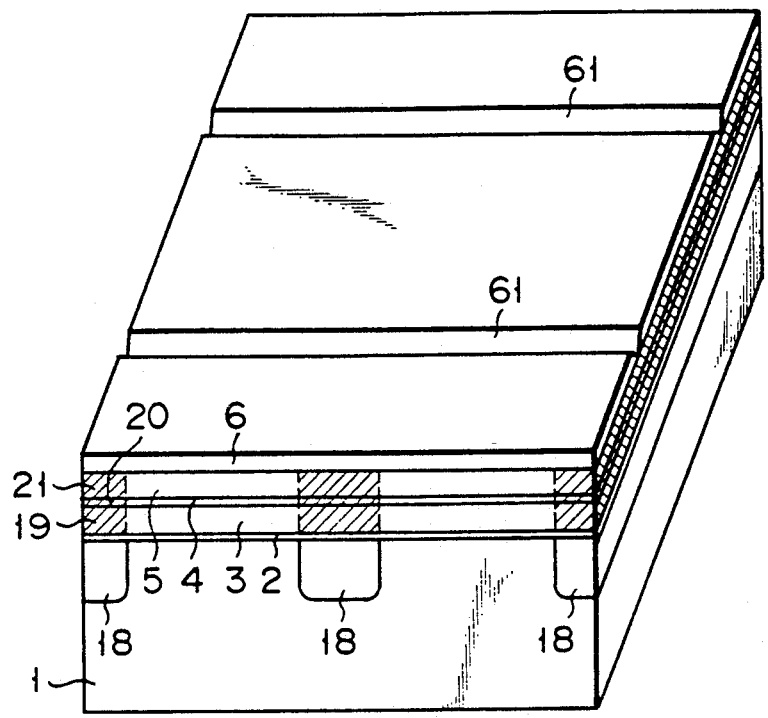
F I G. 1C
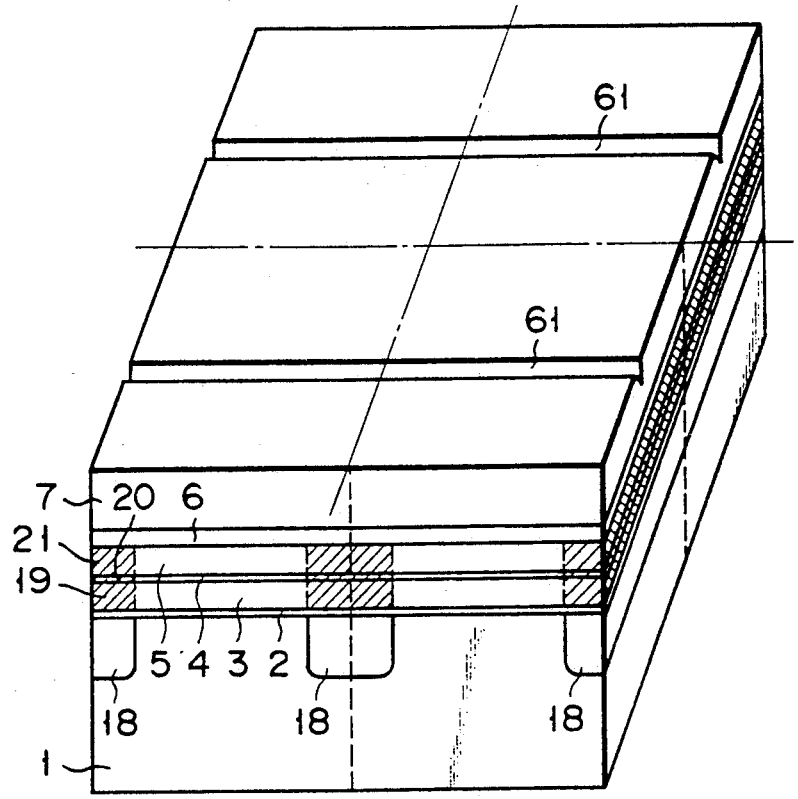
F I G. 1D

SEMICONDUCTOR LASER OF VISIBLE RAY REGION HAVING WINDOW STRUCTURE

BACKGROUND OF THE INVENTION

1. Field of the Invention

The present invention relates to a semiconductor laser used for optical information apparatuses such as optical disk memories, laser printers, etc., and for optical communication, and more particularly, to a semiconductor laser of a visible ray region having a lasing wavelength ranging from 0.6 to 0.7 μm.

2. Description of the Related Art

There has been a great demand for semiconductor lasers having a short lasing wavelength in the field of optical information systems. Semiconductor lasers of a visible ray region having a lasing wavelength ranging from 0.6 to 0.7 μm have already been produced.

FIGS. 4A to 4C show a process for making a conventional InAlGaP semiconductor laser which is generally known as a semiconductor laser of a visible ray region whose lasing wavelength ranges from 0.6 to 0.7 μm.

As shown in FIG. 4A, using metal organic chemical vapor deposition (MOCVD) techniques, an n-type GaAs buffer layer 2, an n-type $In_{0.5}(Ga_{1-x}Al_x)_{0.5}P$ clad layer 3 ($0.4 \leq X \leq 1.0$), an undoped $In_{0.5}(Ga_{1-y}Al_y)_{0.5}P$ active layer 4 ($0 \leq y \leq 0.2$), a p-type $In_{0.5}(Ga_{1-x}Al_x)_{0.5}P$ clad layer 5, and an n-type GaAs current block layer 6 are sequentially formed on an n-type GaAs substrate 1 serving as a semiconductor substrate.

As shown in FIG. 4B, the n-type GaAs current block layer 6 is selectively removed by photoetching to form a mesa-shaped stripe groove so as to expose part of the surface of the clad layer 5.

As shown in FIG. 4C, a p-type GaAs cap layer 7 is formed on the substrate by the MOCVD technique after the mesa-shaped groove is provided.

After the layer 7 is formed, the GaAs substrate 1 is lapped so that a thickness of the structure is about 80 to 90 μm. A p-type electrode (An/Zn) and an n-type electrode (Au/Ge) are then provided on the GaAs cap layer 7 and GaAs substrate 1, respectively. After the wafer is cleaved to provide semiconductor chips, the chip is mounted on a heat sink through the p-type electrode, and then packaged.

On a practical level, the conventional InAlGaP semiconductor lasers have a lasing wavelength of 670 to 690 nm, a light output of 3 to 5 mW, and a life time of 10,000 hours or more. On an investigation level, the semiconductor lasers have a continuous-wave operation (~630 nm) at a room temperature and a maximum light output of 20 to 30 mW (680 nm).

GaAlAs semiconductor lasers having a lasing wavelength of 780 to 850 nm provide the light output of 30–40 mW on the practical level and that of several hundreds mW on the investigation level.

From the above viewpoint, the InAlGaP semiconductor lasers will be required to have the light output of several tens mw at the most advantageous lasing wavelength of 630 to 650 μm in the visible ray region.

When both an Al mixed crystal ratio x of the active layer 4 and an Al mixed crystal ratio y of the n-type clad layer 3 and p-type clad layer 5 are increased, and the light output is increased in order to lower the lasing wavelength of the semiconductor laser, there occurs such a problem that the optical destruction level is lowered at the emitting end surface of the laser beam. The reason is as follows. Since the light density is increased with the increase in the current density injected into the active layer, the emitting end surface of the semiconductor laser approaches the limit of crystal destruction. The limit tends to be lowered as the Al mixed crystal ratio of the lasing region is increased. Such a destruction may easily occur at the end portion exposed to air as compared with the internal portion of the crystal.

The following shows techniques for improving the destruction level of the emitting end surface caused by such a high output operation:

1) The emitting area at the emitting end surface is increased by the structure of epitaxial growth layers to decrease the light density per unit area.

2) The end surface is covered with a transparent protection film to prevent it from being directly exposed to air.

3) The composition of crystal near the emitting end surface is changed, or an electrode structure is provided so that a current does not flow through the emitting end surface, that is, a window structure is provided.

There are also provided the following techniques for forming the window structure:

1') When an active layer, clad layers, etc., are grown on the substrate to obtain a double hetero structure, as shown in FIGS. 5A and 5B, a step or terraced portion is formed at both ends of a substrate 8, on which an n-type buffer layer 9, an n-type clad layer 10, an active layer 11, a p-type clad layer 12, an n-type current block layer 13, and a p-type cap layer 14 are successively grown. Thus, the step is provided at emitting end surfaces of the active layer 11 to render semiconductor layers each having a different composition at end portions.

2') As shown in FIGS. 6A and 6B, an n-type buffer layer 9, an n-type clad layer 10, an active layer 11, a p-type clad layer 12, an n-type current block layer 13, and a p-type cap layer 14 are successively grown on a substrate 8 to obtain a normal double hetero structure. The both ends of the structure are subjected to an impurity diffusion or ion implantation to provide an insulating layer 15 thereat. It is thus possible to prevent the current injection and the lasing action at the end portions.

3') As shown in FIGS. 7A through 7C, an n-type buffer layer 9, an n-type clad layer 10, an active layer 11, a p-type clad layer 12, an n-type current block layer 13, and a p-type cap layer 14 are successively grown on a substrate 8 to obtain a normal double hetero structure. The both ends of the structure are removed by photoetching using a resist mask 16, and a high resistance layer (window layer) 17 having a band gap energy higher than that of the active layer 11 is provided at the removed portions.

However, in the above technique 3'), when the window layers are grown again, an interface of the lasing action may be easy to have a discontinuous surface and accordingly unwanted defect may occur. The semiconductor laser may be therefore deteriorated.

In the above technique 2'), the impurity-doped region may be damaged by thermal diffusion of high impurity concentration or the ion-implantation. Therefore, the semiconductor laser may be deteriorated in the vicinity of the interface of the lasing action.

Although the structure in the above technique 1') does not include the discontinuous surface that is provided by the buried layer as shown in the technique 3'), the crystallinity of inclined portions of the active layer 11 near the emitting end surfaces is generally unsatisfactory and the defect is easy to occur between the inclined portions and flat portions of the active layer.

It is effective that the destruction level at the end surfaces of the semiconductor laser is improved by forming the window layer in the end surfaces. Actually, the above-described techniques of forming the window structure have the respective problems, and a practical semiconductor laser having the window structure has not yet been produced. In particular, materials containing aluminum, such as GaAlAs and InAlGaP, adversely affects the crystallinity of the active layer in the process of making the window layer.

The above-described window structure for improving the optical destruction level in the end surfaces of a semiconductor laser has a drawback in reliability in the process of crystal growth.

SUMMARY OF THE INVENTION

It is, accordingly, an object of the present invention to provide a semiconductor laser having an improved window structure.

It is another object of the present invention to provide a semiconductor laser having a high optical destruction level.

According to one aspect of the present invention, there is provided a semiconductor laser, which includes a semiconductor substrate having a high resistance region at both ends, an active layer sandwiched between two clad layers, and a window structure. The window structure has both end surfaces facing each other. Each of the both end surfaces includes end portions of the active layer and the two clad layers, respectively. Owing to the high resistance regions, the band gap of each of the end portions is higher than that of an internal portion of the active layer and the two clad layers, respectively.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A to 1D are perspective views showing a process of making a semiconductor laser according to an embodiment of the present invention;

DETAILED DESCRIPTION OF THE PREFERRED EMBODIMENTS

An InlGaP semiconductor laser according to an embodiment of the present invention, which is generally known as a semiconductor laser of a visible ray region, will be described in detail with reference to the accompanying drawings.

FIGS. 1A through 1D schematically show a process of making an InAlGaP semiconductor laser having a window structure, which includes four semiconductor chips.

Figure 1A:
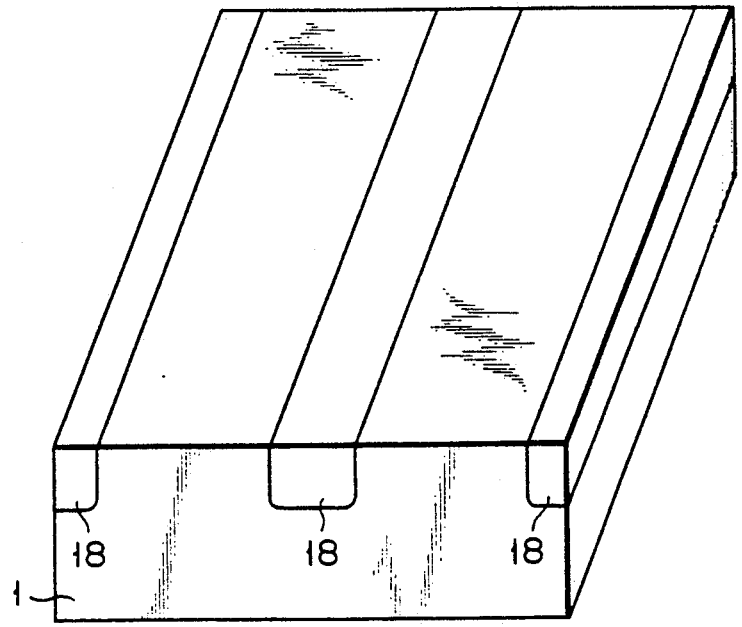

As shown in FIG. 1A, an n-type GaAs substrate 1 is used as a semiconductor substrate. After the substrate 1 is subjected to a photoetching process, stripe-shaped high resistance regions (or p-type regions) 18 are then formed by ion-implantation or impurity diffusion therein. The width of each of the stripe-shaped regions 18 is 20 to 100 $\mu$m, and a distance between them depends upon the length of an optical resonator and it is, for example, 200 to 400 $\mu$m. The regions 18 are formed so deeply (e.g., 10 $\mu$m or more) as to sufficiently have a current confinement effect against the substrate 1.

Figure 1B:
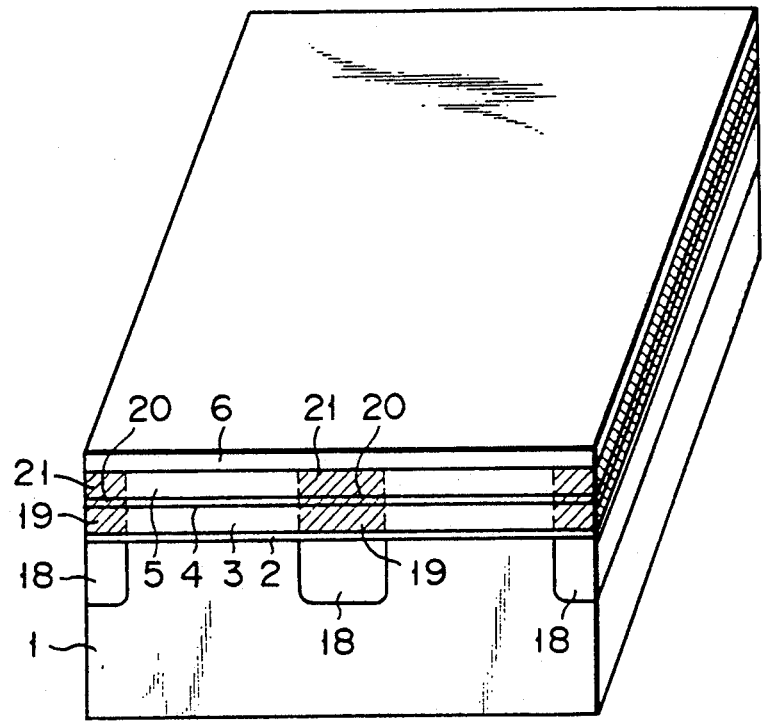

As shown in FIG. 1B, after the high resistance regions 18 are provided, an n-type GaAs buffer layer 2, an n-type $In_{0.5}(Ga_{1-x}Al_x)_{0.5}P$ clad layer ($0.4 \leq x \leq 1.0$) 3, an undoped $In_{0.5}(Ga_{1-y}Al_y)_{0.5}P$ active layer ($0 \leq y \leq 0.2$) 4, a p-type $In_{0.5}(Ga_{1-x}Al_x)_{0.5}P$ clad layer 5, and an n-type GaAs current block layer 6 are formed in sequence on the substrate by the MOCVD technique. The clad layers 3 and 5 and active layer 4 for providing the double hetero structure are composed of InAlGaP quaternary mixed crystal, and are lattice matched with the semiconductor substrate 1. The clad layer 3, the active layer 4 and the clad layer 5 include hatched portions 19, 20 and 21, respectively, each of which has a high band gap energy as compared with its peripheral portion according to the high resistance regions 18. This will be described later.

As shown in FIG. 1C, mesa-shaped stripe grooves 61 are formed in the n-type GaAs current block layer 6 by photoetching so as to partially expose the surfaces of the layers 5 and 21. The stripe grooves 61 cross the stripe-shaped regions 18.

As shown in FIG. 1D, after the stripe grooves are provided, a p-type GaAs cap layer 7 is grown on the epitaxial wafer by the MOCVD technique. The substrate 1 of the epitaxial wafer is then lapped so that the thickness of the epitaxial wafer is 80 to 100 $\mu$m, and a p-type electrode (An/Zn) and an n-type electrode (Au/Ge) are arranged on the GaAs cap layer 7 and GaAs substrate 1, respectively. The wafer is cleaved along the alternate long and short dash lines and dotted lines to provide semiconductor chips. Each of the chips is mounted on a heat sink through the p-type electrode and then packaged.

Figure 2:
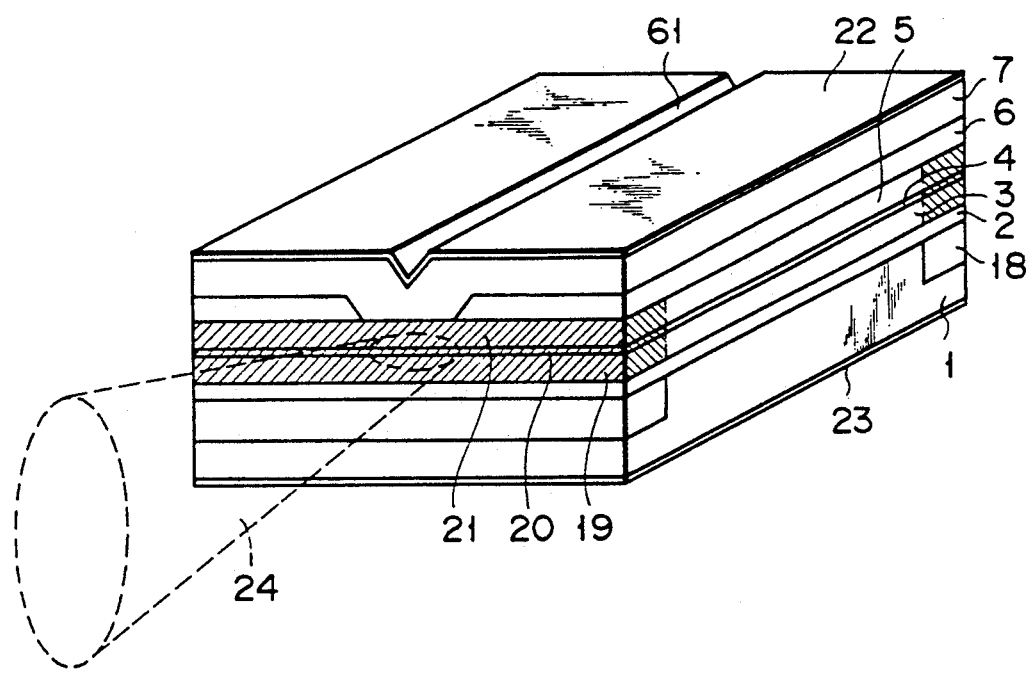
FIG. 2 is a perspective view showing a semiconductor chip of the semiconductor laser provided by the process shown in FIGS. 1A to 1D.

FIG. 2 shows the In AlGaP semiconductor laser made by the above process which is emitting a laser beam from its emitting end surface. In FIG. 2, reference numeral 22 indicates a p-type electrode (An/Zn), 23 shows an n-type electrode, and 24 denotes a beam pattern.

If the conductivity type or the conductivity of one region of the semiconductor substrate 1 corresponding to the lower portion of the emitting end surface of the laser beam described above is previously provided so as to be different from that of the other region thereof, it is possible that the band gap energy of the emitting end surface defined by the clad layer 3, the active layer 4 and the clad layer 5 grown on the substrate 1 can be made higher than that of an internal lasing region. The reason will be described as follows.

As a specific phenomenon appearing when an InAlGaP layer including InAlGa is grown on the n-type GaAs substrate 1 by the MOCVD technique, it has been known that the band gap energy varies within a range of growth temperature Tg, which is disclosed in, for example, Gomyo et al., J. Crystal Growth 77 (1986) 367 and Ohba et al., J. Crystal Growth 77 (1986) 374. The phenomenon is deemed to be both an effect such that the composition of crystal is varied by changing the group III element added to the crystal due to the growth temperature Tg and an effect such that the crystal structure is varied in only the same composition within a range of the growth temperature Tg, which is disclosed in, for example, Suzuki et al., J. Crystal Growth 93 (1988) 396 and Nozaki et al., J. Crystal Growth 93 (1988) 406.

If an n-type GaAs substrate and a semi-insulating GaAs substrate are used as a semiconductor substrate, it has been generally known that the surface temperatures of the substrates differ from each other in vapor phase deposition technique such as MOCVD techniques when they are heated. It may be considered that the difference in surface temperatures depends upon differences in the thermal conductivity and the radiation rate caused by difference in the conductivity. Further, it has been confirmed that the effect of the difference in surface temperatures occurs even if part of the conductivity type of the substrate surface differs from each other.

Figure 3:
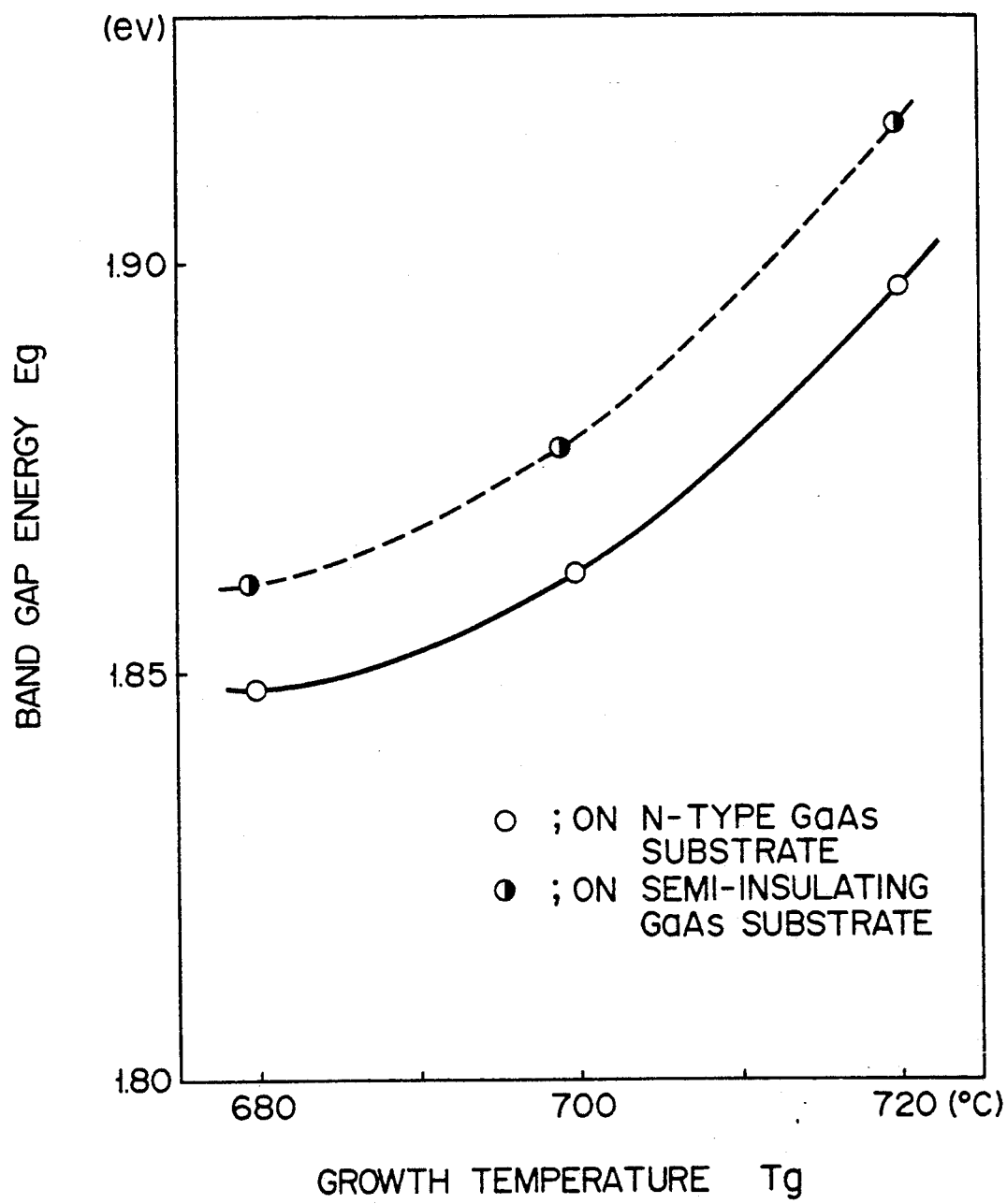
FIG. 3 is a graph showing a change (room temperature) in band gap energy of an active layer of the semiconductor laser, shown in FIGS. 1A to 1D, with respect to growth temperature Tg.
Figure 4A:
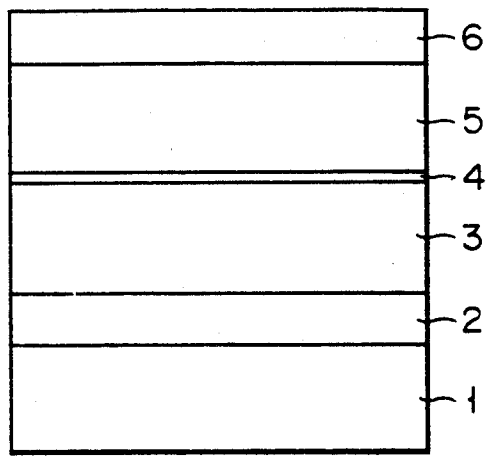
FIGS. 4A to 4C are cross-sectional views showing a process of making a conventional semiconductor laser.
Figure 4B:
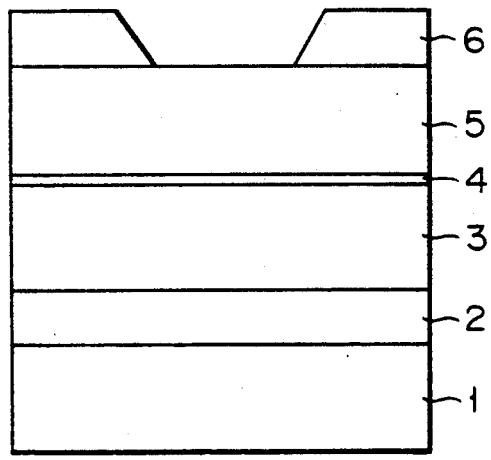
Figure 4C:
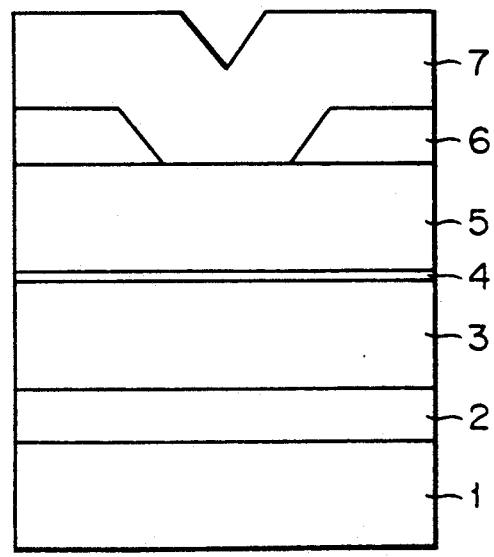
Figure 5A:
FIGS. 5A and 5B are cross-sectional views showing a conventional process of forming a window structure at emitting end surfaces of a semiconductor laser.
Figure 5B:
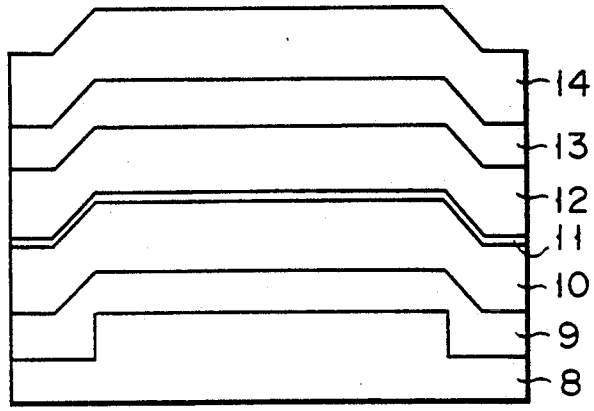
Figure 6A:
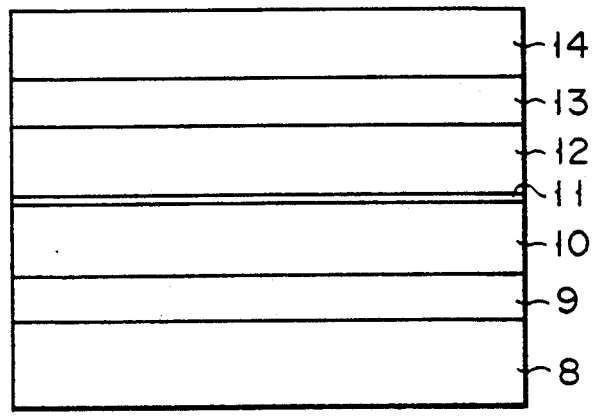
FIGS. 6A and 6B are cross-sectional views showing another conventional process of forming a window structure at emitting and surfaces of the semiconductor laser.
Figure 6B:
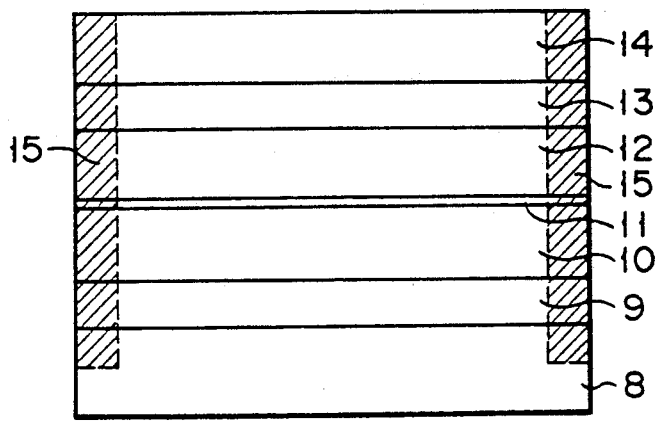
Figure 7A:
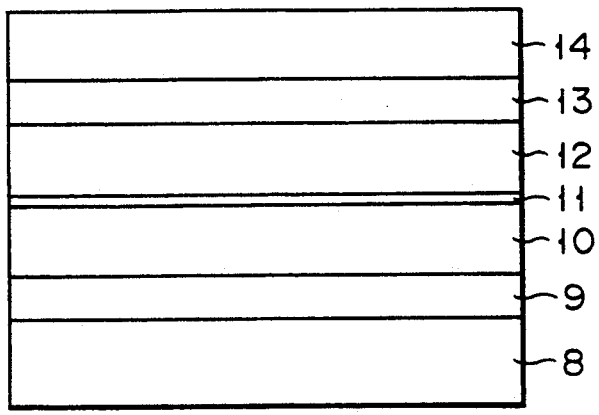
FIGS. 7A, 7B and 7C are cross-sectional views showing still another conventional process of forming a window structure at emitting end surfaces of the semiconductor laser.
Figure 7B:
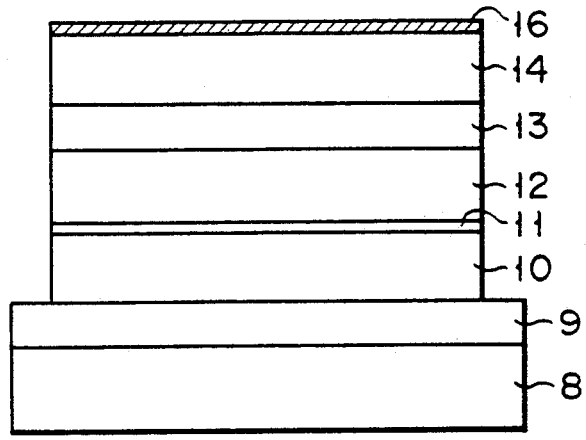
Figure 7C:
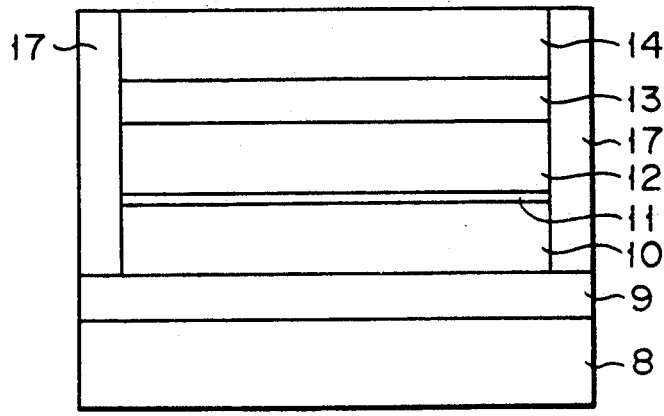

FIG. 3 is a graph showing a change (room temperature) in band gap energy of the active layer with respect to the growth temperature Tg when the crystal growth described in the embodiment is applied to different conductivity type GaAs substrate (InAlGaP/InGaP epitaxial growth wafer with double hetero structure) in view of the above effect. In this case, the active layer is composed of $In_{0.5}Ga_{0.5}P$. It is apparent from FIG. 3 that the band gap energy of the active layer is changed by both the growth temperature Tg and the conductivity of the substrates. It is also apparent from FIG. 3 that the band gap energy of the active layer formed on the semi-insulating substrate is higher than that of the active layer formed on the n-type GaAs substrate by about 20 mV, and the wavelength of the former is shorter than that of the latter by 10 nm.

In the semiconductor laser provided by the above-described process, since the high resistance region is provided at the emitting end surface of the substrate, the band gap energy of the clad layers 3 and 5 and active layer 4 formed above the part of the substrate can be made higher than that of the internal portions. A window effect can thus be obtained.

In the semiconductor laser, if both a width of the high resistance region 18 at the emitting end surface and a distance between the region 18 and the lasing region are optimized, the current density near the emitting end surface can be decreased, thereby providing a greater window effect.

As described above, according to the InAlGaP semiconductor laser of the above embodiment, the window structure can be easily obtained as compared with the prior art semiconductor laser, using the specific properties of the mixed crystals No problems therefore may occur in the reliability in the crystal growth process containing aluminum.

The high resistance region 18 is formed in the n-type substrate by ion-implantation. However, the present invention is not limited to the ion-implantation in order to render the temperature difference to the substrate surface during the crystal growth, but any other techniques providing the similar effect can be adopted. Further, the present invention is not limited to InAlGaP used as the material of semiconductor lasers, but can be applied to all materials having such properties that the band gap energy varies with the growth temperature Tg.

Since the semiconductor laser according to the present invention have such a window structure that the band gap energy at the emitting end surface is higher than that at the internal lasing region, a light absorption in the emitting end surface will be reduced. For providing the window structure, the conductivity type or the conductivity of one region of the semiconductor substrate corresponding to the lower portion of the emitting end surface is previously provided so as to be different from that of the other region thereof. Therefore, it will be possible to make the band gap energy at the emitting end surface of the clad layers and active layer formed above the region of the substrate higher than that at the internal lasing region. No problems will occur in reliability in the crystal growth process even if aluminum is used.

It is further understood by those skilled in the art that the foregoing description is the preferred embodiment and that various changes and modifications may be made in the invention without departing from the spirit and scope thereof.

What is claimed is:

1. A semiconductor laser comprising:
   a semiconductor substrate having a high resistance region at both ends, said high resistance region extending in a direction;
   an active layer provided above said semiconductor substrate, said active layer being sandwiched between two clad layers to provide both end surfaces facing each other; and
   a window structure having said both end surfaces, each of said both end surfaces including end portions of said active layer and said two clad layers, respectively, said end portions being disposed above each of said high resistance region,
   wherein each of said end portions has a band gap higher than an internal portion of said active layer and said two clad layers, respectively.

2. The semiconductor laser according to claim 1, wherein said end portions provide a cleavage facet.

3. The semiconductor laser according to claim 1, wherein said high resistance region has a stripe-shaped configuration.

4. The semiconductor laser according to claim 3, wherein said active layer is provided above said high resistance region through one of said clad layers 5. The semiconductor laser according to claim 4, wherein a current block layer is provided on said one of said clad layers.

6. The semiconductor laser according to claim 5, wherein a mesa-shaped stripe groove is provided in said current block layer to expose a surface of said one of said clad layers.

7. The semiconductor laser according to claim 6, wherein said mesa-shaped stripe groove crosses said high resistance region.

8. The semiconductor laser according to claim 6, wherein a cap layer is provided on said current block layer.

9. The semiconductor laser according to claim 1, wherein said active layer and said two clad layers are comprised of InAlGaAs.

10. The semiconductor laser according to claim 1, wherein a buffer layer is provided on said semiconductor substrate.

11. The semiconductor laser according to claim 1, wherein at least one of said both end surfaces serves as an emitting end surface of a laser beam.

* * * * *